United States Patent
Nishikawa et al.

(10) Patent No.: US 9,847,842 B2
(45) Date of Patent: Dec. 19, 2017

(54) OPTICAL RECEPTION CIRCUIT

(71) Applicant: Panasonic Intellectual Property Management Co., Ltd., Osaka (JP)

(72) Inventors: Hideo Nishikawa, Mie (JP); Yuichi Niimura, Osaka (JP); Takeshi Nakasuji, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/114,786

(22) PCT Filed: Feb. 23, 2015

(86) PCT No.: PCT/JP2015/000838
§ 371 (c)(1),
(2) Date: Jul. 27, 2016

(87) PCT Pub. No.: WO2015/133080
PCT Pub. Date: Sep. 11, 2015

(65) Prior Publication Data
US 2016/0352433 A1 Dec. 1, 2016

(30) Foreign Application Priority Data

Mar. 3, 2014 (JP) .................................. 2014-040647

(51) Int. Cl.
*H04B 10/69* (2013.01)
*H03K 5/08* (2006.01)
(Continued)

(52) U.S. Cl.
CPC ............... *H04B 10/69* (2013.01); *H03K 5/08* (2013.01); *H04B 10/60* (2013.01); *H04B 10/66* (2013.01); *H04B 10/695* (2013.01)

(58) Field of Classification Search
None
See application file for complete search history.

(56) References Cited

U.S. PATENT DOCUMENTS

| 8,023,835 B2 | 9/2011 | Kim et al. | |
|---|---|---|---|
| 2004/0100317 A1* | 5/2004 | Suzunaga | H04B 10/69 327/307 |

(Continued)

FOREIGN PATENT DOCUMENTS

| JP | 62-042649 | 2/1987 |
|---|---|---|
| JP | 62-285537 | 12/1987 |

(Continued)

OTHER PUBLICATIONS

International Search Report of PCT application No. PCT/JP2015/000838 dated Mar. 17, 2015.

*Primary Examiner* — Darren E Wolf
(74) *Attorney, Agent, or Firm* — McDermott Will & Emery LLP

(57) ABSTRACT

An optical reception circuit includes a first photodetector, a first transimpedance amplifier, a level shift circuit, a second photodetector, a second transimpedance amplifier, a peak hold circuit, and a comparator. The first transimpedance amplifier converts a first light current from the first photodetector to a first voltage. The level shift circuit generates a signal voltage from the first voltage. The second transimpedance amplifier converts the second light current from the second photodetector to a second voltage. The peak hold circuit holds a peak voltage of the second voltage as a first threshold voltage. The comparator compares the signal voltage with the first threshold voltage.

18 Claims, 5 Drawing Sheets

(51) Int. Cl.
*H04B 10/60* (2013.01)
*H04B 10/66* (2013.01)

(56) References Cited

U.S. PATENT DOCUMENTS

| | | | |
|---|---|---|---|
| 2007/0075751 A1* | 4/2007 | Furuya | H03K 3/02337 |
| | | | 327/112 |
| 2008/0230683 A1 | 9/2008 | Uo et al. | |
| 2010/0019132 A1 | 1/2010 | Uo | |
| 2010/0172656 A1 | 7/2010 | Saitou et al. | |

FOREIGN PATENT DOCUMENTS

| | | |
|---|---|---|
| JP | 63-278382 | 11/1988 |
| JP | 2008-236392 | 10/2008 |
| JP | 2010-028768 | 2/2010 |
| JP | 2010-178327 | 8/2010 |

\* cited by examiner

OPTICAL RECEPTION CIRCUIT

This application is a U.S. national stage application of the PCT international application No. PCT/JP2015/000838.

TECHNICAL FIELD

The disclosure relates to an optical reception circuit.

BACKGROUND ART

There is known an optical reception circuit that converts a light signal to an electric signal. An existing optical reception circuit includes a head amplifier, a dummy amplifier, a peak detecting unit, an average value detecting unit, and a differential amplifier. In the existing optical reception circuit, the peak detecting unit detects a peak voltage between the head amplifier and the differential amplifier. Then, the peak detecting unit outputs the peak voltage detected to the average value detecting unit. The average value detecting unit calculates a threshold voltage from the peak voltage received from the peak detecting unit and a voltage received from the dummy amplifier, and outputs the threshold voltage to the differential amplifier.

In this way, the existing optical reception circuit uses the peak detecting unit and the average value detecting unit to generate a threshold voltage for preventing the distortion of an output waveform from the differential amplifier. Examples of prior art documents related to this application include PTL 1.

CITATION LIST

PTL

PTL 1: Japanese Patent Unexamined Publication No. S62-285537

SUMMARY OF THE INVENTION

An optical reception circuit includes a first photodetector, a first transimpedance amplifier, a level shift circuit, a second photodetector, a second transimpedance amplifier, a peak hold circuit, and a comparator. The first photodetector receives a light signal and converts it to a first light current. The first transimpedance amplifier, connected to the first photodetector, converts the first light current to a first voltage. The level shift circuit, connected to the first transimpedance amplifier, generates a signal voltage that is the first voltage shifted to the low voltage. The second photodetector receives a light signal and converts it to a second light current. The second transimpedance amplifier, connected to the second photodetector, converts the second light current to a second voltage that is higher than the minimum signal voltage and lower than the maximum signal voltage. The peak hold circuit, connected to the second transimpedance amplifier, holds the peak second voltage as a first threshold voltage. The comparator, connected to the level shift circuit and the peak hold circuit, compares the signal voltage with the first threshold voltage.

DESCRIPTION OF EMBODIMENTS

Recent demands represent an optical reception circuit that reduces a consumption current with a configuration simpler than the existing ones.

First Exemplary Embodiment

Figure 1:
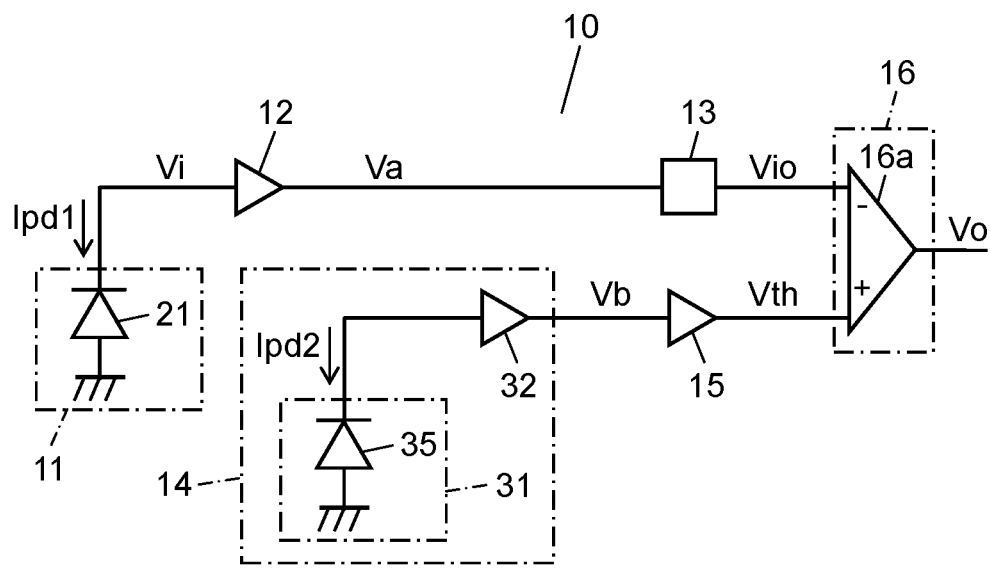
FIG. 1 is an outline block diagram of an optical reception circuit according to the first exemplary embodiment.
Figure 2:
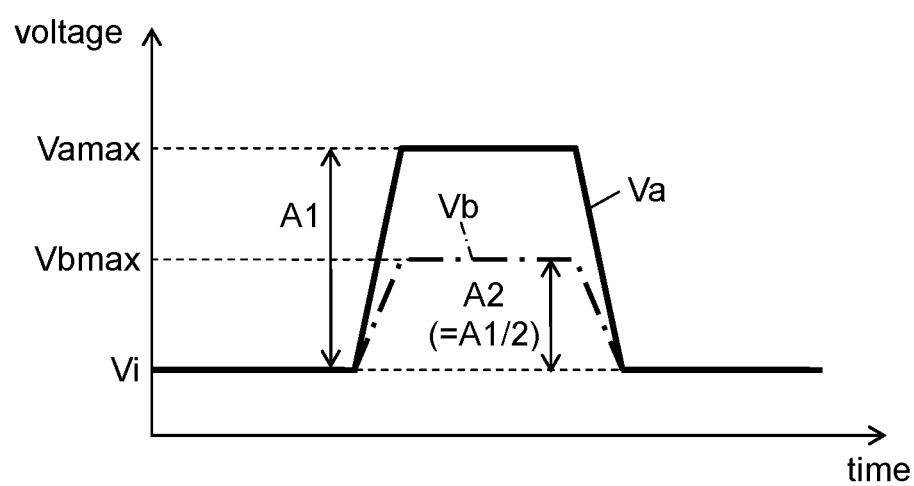
FIG. 2 illustrates relationship between a first voltage and a second voltage in the optical reception circuit according to the first embodiment.
Figure 3:
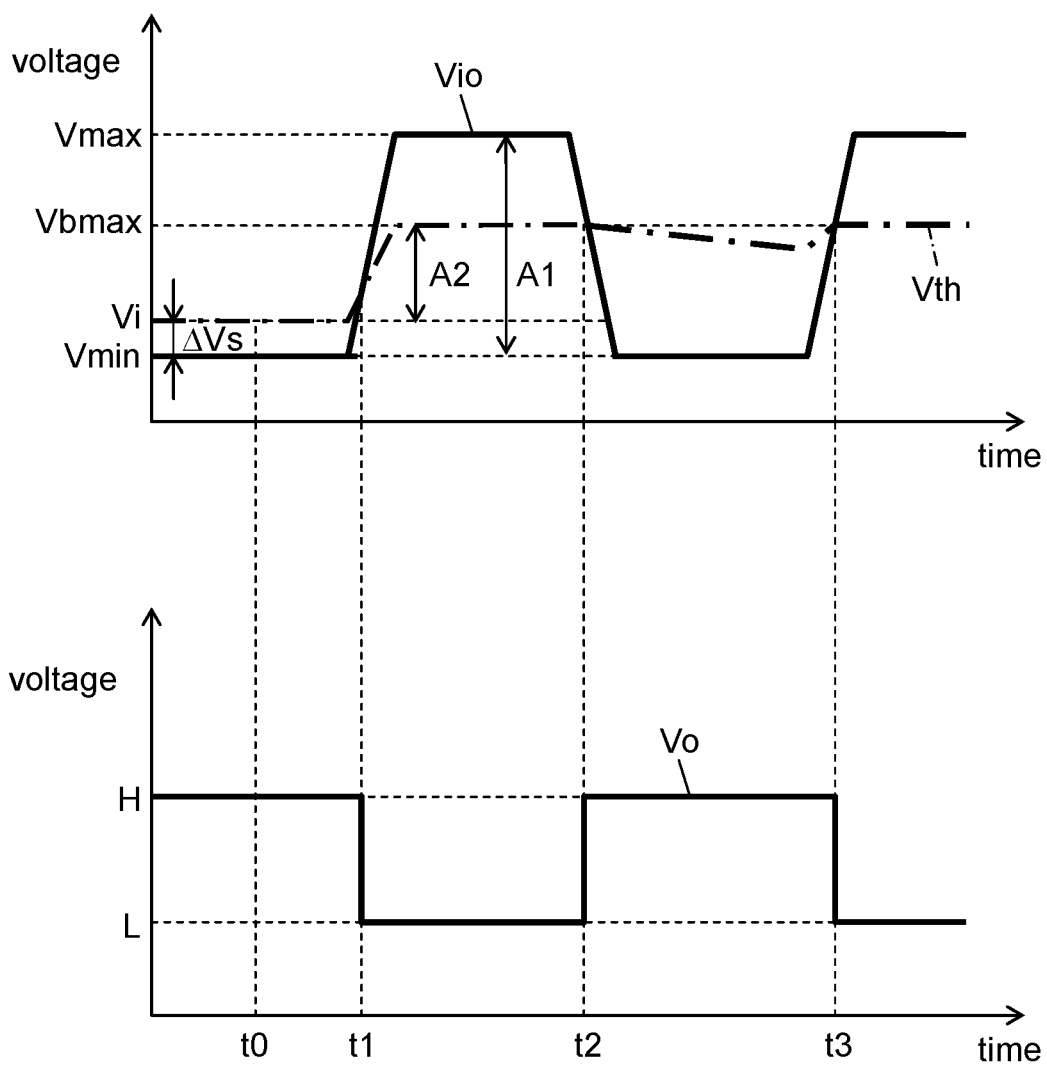
FIG. 3 illustrates relationship between a signal voltage, a threshold voltage, and a waveform output from the comparator, in the optical reception circuit according to the first embodiment.

Hereinafter, a description is made of optical reception circuit 10 of this embodiment referring to FIGS. 1 through 3. FIG. 1 is an outline block diagram of optical reception circuit 10 according to the first exemplary embodiment. FIG. 2 illustrates relationship between first voltage Va and second voltage Vb in optical reception circuit 10 of the first embodiment. FIG. 3 illustrates relationship between signal voltage Vio, threshold voltage Vth, and a waveform (voltage Vo) output from the comparator in optical reception circuit 10 of the first embodiment.

Configuration

Optical reception circuit 10 includes first photodetector 11, first transimpedance amplifier (hereinafter, referred to as first TIA) 12, level shift circuit 13, second photodetector 31, second transimpedance amplifier (hereinafter, referred to as second TIA) 32, peak hold circuit 15, and comparator 16.

First photodetector 11 receives a light signal and converts it to a first light current.

First transimpedance amplifier 12, connected to first photodetector 11, converts the first light current to a first voltage.

Level shift circuit 13, connected to first transimpedance amplifier 12, generates a signal voltage that is the first voltage shifted to the low voltage.

Second photodetector 31 receives a light signal and converts it to a second light current.

Second transimpedance amplifier 32, connected to second photodetector 31, converts the second light current to a second voltage that is higher than the minimum signal voltage and lower than the maximum signal voltage.

Peak hold circuit 15, connected to the second transimpedance amplifier, holds the peak second voltage as a first threshold voltage.

Comparator 16, connected to level shift circuit 13 and peak hold circuit 15, compares the signal voltage with the first threshold voltage.

Second photodetector 31 and second transimpedance amplifier 32 compose converter circuit 14.

Hereinafter, a detailed description is made of the configuration of optical reception circuit 10. First photodetector 11, having first photodiode 21, converts a light signal received to light current Ipd1 (a first light current).

The anode side of first photodiode 21 is grounded. The cathode side of first photodiode 21 is connected to the input end of first TIA 12.

The output end of first TIA 12 is connected to the input end of level shift circuit 13. First TIA 12 converts light current Ipd1 flowing through first photodiode 21 to voltage Va (hereinafter, referred to as first voltage Va) and outputs the voltage to level shift circuit 13.

Here, assumption is made that the translation impedance of first TIA 12 is r1 [Ω], the voltage value of voltage Vi at the cathode side of first photodiode 21 is vi [V], and the current value of light current Ipd1 flowing through first photodiode 21 is ipd1 [A]. Then, voltage value va [V] of first voltage Va is expressed by following expression (1).

$$va = vi + r1 \times ipd1 \quad \text{expression (1)}$$

The output end of level shift circuit 13 is connected to the inverting input end of comparator 16. Level shift circuit 13 shifts first voltage Va to the negative side by given shift amount ΔVs, and then outputs resulting voltage Vio (hereinafter, referred to as signal voltage Vio) to comparator 16. Here, shift amount ΔVs is smaller than ½ displacement range A1 of first voltage Va. As shown in FIG. 2, displacement range A1 of first voltage Va falls in a range (displacement range) between minimum voltage Vi of first voltage Va and maximum voltage Vamax of first voltage Va. Then, as shown in FIG. 3, the displacement range of signal voltage Vio is equal to displacement range A1 of first voltage Va. Signal voltage Vio is a value that is first voltage Va shifted to the negative side by shift amount ΔVs (Vio=Va−ΔVs).

Second photodetector 31 includes second photodiode 35.

The anode side of second photodiode 35 is grounded. The cathode side of second photodiode 35 is connected to the input end of second TIA 32. Second photodiode 35 receives a light signal and converts it to light current Ipd2 (a second light current). Here, light signals received by first photodiode 21 and second photodiode 35 are those output from a common light source. The light receiving area within which second photodiode 35 receives a light signal is ½ that of first photodiode 21. Here, the photoelectric conversion efficiency with which second photodiode 35 converts light signals per unit area to a light current is equal to that of first photodiode 21. Note that photoelectric conversion efficiency is conversion efficiency with which light signals per unit area are converted to a light current. Resultingly, when first photodiode 21 and second photodiode 35 receive light signals, light current Ipd2 of second photodiode 35 is ½ light current Ipd1 of first photodiode 21.

The output end of second TIA 32 is connected to the input end of peak hold circuit 15. Second TIA 32 converts light current Ipd2 flowing through second photodiode 35 to second voltage Vb and outputs it to peak hold circuit 15.

The voltage at the cathode side of second photodiode 35 is at the same level of voltage Vi of first photodiode 21 when a light signal is not being received. Assumption is made that the translation impedance of second TIA 32 is r2 [Ω] and the current value of light current Ipd2 flowing through second photodiode 35 is ipd2 [A]. Here, the conversion efficiency with which second TIA 32 converts light current Ipd2 to a voltage is the same as that with which first TIA 12 converts light current Ipd1 to a voltage. That is, r1=r2. Then, voltage value vb [V] of second voltage Vb is expressed by following expression (2).

$$vb = vi + r2 \times ipd2 \quad \text{expression (2)}$$

As described above, light current Ipd2 is ½ light current Ipd1, and the conversion efficiency of second TIA 32 is equal to that of first TIA 12. Accordingly, from expressions (1) and (2), displacement range A2 of second voltage Vb is ½ displacement range A1 of first voltage Va. Here, as shown in FIG. 2, displacement range A2 of second voltage Vb falls in a range (displacement range) between minimum voltage Vi of second voltage Vb and maximum voltage Vbmax of second voltage Vb.

Displacement range A2 of second voltage Vb is ½ displacement range A1 of first voltage Va. Shift amount ΔVs by which level shift circuit 13 shifts first voltage Va to signal voltage Vio is smaller than ½ displacement range A1. Then, as shown in FIG. 3, maximum voltage Vbmax of the second voltage is lower than maximum voltage Vmax of signal voltage Vio.

Further, when a light signal is not being received by first photodetector 11 and second photodetector 31, first voltage Va and second voltage Vb are the same voltage Vi from expressions (1) and (2). The shift amount by which level shift circuit 13 shifts first voltage Va to signal voltage Vio is ΔVs. Then, as shown in FIG. 3, minimum voltage Vi of second voltage Vb is higher than minimum voltage Vmin of signal voltage Vio.

The output end of peak hold circuit 15 is connected to the non-inverting input end of comparator 16. Peak hold circuit 15 holds a peak voltage of second voltage Vb. Concretely, peak hold circuit 15 includes a capacitor (unillustrated) that charges and discharges. Here, "holds the voltage" means a voltage drop due to discharge falls within an error range.

Comparator 16, including operational amplifier 16a, compares signal voltage Vio with threshold voltage Vth (the first threshold voltage) and outputs voltage Vo.

Operation

Hereinafter, a description is made of operation of optical reception circuit 10 of this embodiment referring to FIGS. 1 through 3.

When a light signal is not being received by first photodetector 11 and second photodetector 31 (e.g., time point t0 in FIG. 3), a light current does not flow through first photodetector 11 and second photodetector 31. Accordingly, from above expressions (1) and (2), first voltage Va and second voltage Vb are the same voltage Vi. First voltage Va is shifted to the negative side by shift amount ΔVs by level shift circuit 13. Peak hold circuit 15 outputs threshold voltage Vth that is roughly equal to second voltage Vb. This causes signal voltage Vio to be lower than threshold voltage Vth, resulting in high level H of voltage Vo output from comparator 16.

Meanwhile, when light signals have been received by first photodetector 11 and second photodetector 31, light current Ipd1 flows through first photodetector 11; light current Ipd2 flows through second photodetector 31. At this moment, first voltage Va represents a voltage value determined by expression (1). Concretely, when a light signal is received by first photodetector 11, light current Ipd1 increases to raise first voltage Va and signal voltage Vio. When a light signal is received by converter circuit 14, light current Ipd2 increases to raise second voltage Vb and threshold voltage Vth. Displacement range A1 of signal voltage Vio is larger than displacement range A2 of threshold voltage Vth, and thus there is a time point when the magnitude relationship between signal voltage Vio and threshold voltage Vth are reversed. Accordingly, when signal voltage Vio reaches threshold voltage Vth while both signal voltage Vio and threshold voltage Vth are increasing (time point t1 in 3), voltage Vo output from comparator 16 becomes low level L.

Further, when first photodetector 11 and second photodetector 31 cease to receive a light signal, light current Ipd1 flowing through first photodetector 11 decreases, and first voltage Va and signal voltage Vio also decrease. Although second voltage decreases as well, peak voltage (Vbmax in FIG. 3) is held by peak hold circuit 15. Accordingly, signal voltage Vio becomes same as threshold voltage Vth at a certain time point (time t2 in FIG. 2), resulting in high level H of voltage Vo output from comparator 16.

Subsequently, when first photodetector 11 and second photodetector 31 receive light signals, signal voltage Vio increases as described above, and signal voltage Vio reaches threshold voltage Vth at a certain time point (t3 in FIG. 3). At this moment, voltage Vo output from comparator 16 becomes low level L.

In optical reception circuit 10 of this embodiment, peak hold circuit 15 holds a peak voltage of second voltage Vb, which suppresses the distortion of the output waveform of voltage Vo output from comparator 16.

SUMMARY

As described hereinbefore, optical reception circuit 10 of this embodiment uses peak hold circuit 15 to generate threshold voltage Vth. Meanwhile, an existing optical reception circuit uses a peak detecting unit and an average value detecting unit to generate a threshold voltage. In other words, optical reception circuit 10 generates threshold voltage Vth using circuit components less than the existing optical reception circuit. Resultingly, optical reception circuit 10 consumes less current than the existing one.

In optical reception circuit 10 of this embodiment, converter circuit 14 and comparator 16 are connected with each other through peak hold circuit 15. Optical reception circuit 10 uses level shift circuit 13 and peak hold circuit 15 for example to generate threshold voltage Vth that is higher than minimum signal voltage Vio and lower than maximum signal voltage Vio. Then, optical reception circuit 10 outputs voltage Vo on the basis of threshold voltage Vth, which suppresses the distortion of the output waveform of comparator 16.

Further, optical reception circuit 10 of this embodiment has a smaller light receiving area of second photodiode 35 than that of first photodiode 21. Resultingly, optical reception circuit 10 passes light current Ipd2 flowing through second photodetector 31 less than light current Ipd1 flowing through first photodetector 11, allowing the displacement range of threshold voltage Vth to be adjusted. Optical reception circuit 10 adjusts the displacement range of threshold voltage Vth to light current Ipd2. Consequently, TIAs of the same efficiency with which a light current is converted to a voltage can be used for first TIA 12 and second TIA 32.

Optical reception circuit 10 of this embodiment has displacement range A2 of second voltage Vb that is ½ displacement range A1 of first voltage Va. Resultingly, optical reception circuit 10 generates threshold voltage Vth that is close to ½ the fluctuation range of signal voltage Vio. Then, optical reception circuit 10 outputs voltage Vo on the basis of threshold voltage Vth, which further suppresses the distortion of the output waveform of comparator 16.

Second Exemplary Embodiment

Figure 4:
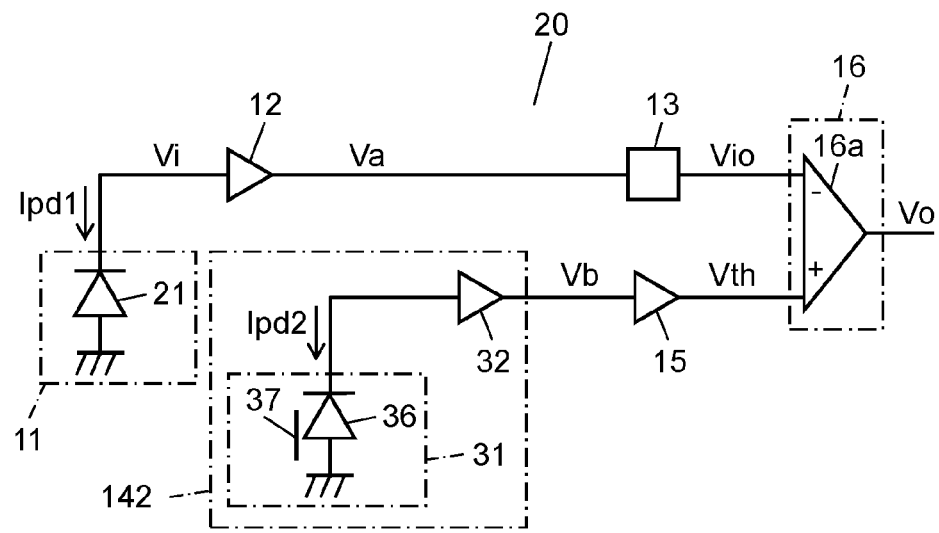
FIG. 4 is an outline block diagram of an optical reception circuit according to the second exemplary embodiment.

FIG. 4 is an outline block diagram of optical reception circuit 20 according to the second exemplary embodiment. Optical reception circuit 20 is different from the first embodiment in that second photodetector 31 includes second photodiode 36 (different from second photodiode 35) and light blocking part 37. In this embodiment, a component same as that of the first embodiment is given the same reference mark to omit its description.

The anode side of second photodiode 36 is grounded. The cathode side of second photodiode 36 is connected to the input end of second TIA 32. The light receiving area where second photodiode 36 receives light signals is equal to that of first photodiode 21. First photodiode 21 and second photodiode 36 are formed of the same type of elements.

Light blocking part 37 is formed of a component that does not transmit light. Light blocking part 37 is placed so as to cover ½ the light receiving area of second photodiode 36. Resultingly, the light amount of light signals received by second photodiode 36 is ½ that by first photodiode 21. Accordingly, light current Ipd2 of second photodiode 36 is ½ light current Ipd1 of first photodiode 21.

Optical reception circuit 20 of this embodiment has operation and effects same as those of the first embodiment, and thus their description is omitted.

As described above, optical reception circuit 20 of this embodiment uses peak hold circuit 15 to generate threshold voltage Vth. Meanwhile, an existing optical reception circuit uses a peak detecting unit and an average value detecting unit to generate a threshold voltage. In other words, optical reception circuit 20 generates threshold voltage Vth using circuit components less than the existing optical reception circuit. Resultingly, optical reception circuit 20 consumes less current than the existing one when generating threshold voltage Vth.

In optical reception circuit 20 of this embodiment, converter circuit 142 and comparator 16 are connected with each other through peak hold circuit 15. Optical reception circuit 20 uses peak hold circuit 15 for example to generate threshold voltage Vth that is higher than minimum signal voltage Vio and lower than maximum signal voltage Vio. Then, optical reception circuit 20 outputs voltage Vo on the basis of threshold voltage Vth, which suppresses the distortion of the output waveform of comparator 16.

Further, optical reception circuit 20 of this embodiment is provided with light blocking part 37 in second photodiode 36 to make the light amount of light signals received by second photodiode 36 smaller than that by first photodiode 21. Light current Ipd2 flowing through second photodetector 31 is made smaller than light current Ipd1 flowing through first photodetector 11 to allow the displacement range of threshold voltage Vth to be adjusted. Optical reception circuit 20 adjusts the displacement range of threshold voltage Vth to light current Ipd2. Consequently, TIAs of the same efficiency with which a light current is converted to a voltage can be used for first TIA 12 and second TIA 32.

Optical reception circuit 20 of this embodiment has displacement range A2 of second voltage Vb that is ½ displacement range A1 of first voltage Va. Resultingly, optical reception circuit 20 generates threshold voltage Vth that is close to ½ the fluctuation range of signal voltage Vio. Then, optical reception circuit 20 outputs voltage Vo on the basis of threshold voltage Vth, which further suppresses the distortion of the output waveform of comparator 16.

Third Exemplary Embodiment

Figure 5:
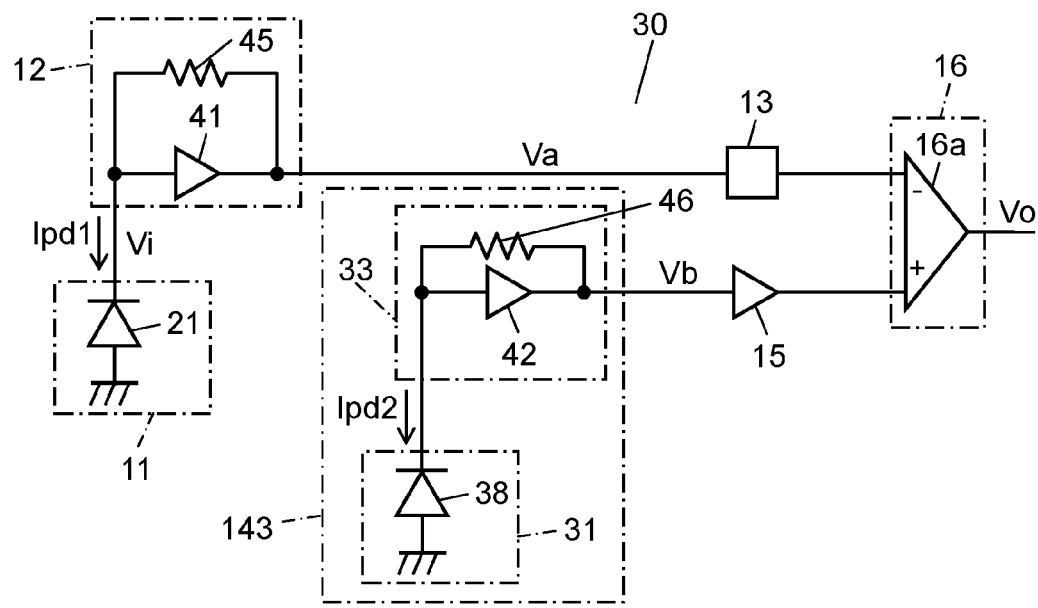
FIG. 5 is an outline block diagram of an optical reception circuit according to the third exemplary embodiment.

FIG. 5 is an outline block diagram of optical reception circuit 30 according to the third exemplary embodiment. Optical reception circuit 30 of this embodiment is different from the first embodiment in that second photodetector 31 includes second photodiode 38 that is different from second photodiode 35. Further, this embodiment is different from the first embodiment in that converter circuit 143 includes second TIA 33 that is different from second TIA 32. Furthermore, the configuration of first TIA 12 is different from that of the first embodiment. In this embodiment, a component same as that of the first embodiment is given the same reference mark to omit its description.

The anode side of second photodiode 38 is grounded. The cathode side of second photodiode 38 is connected to the input end of second TIA 33. The light receiving area where second photodiode 38 receives light signals is equal to that of first photodiode 21. First photodiode 21 and second photodiode 38 are formed of the same type of elements.

As shown in FIG. 5, first TIA 12 includes first amplifier 41 and first resistance 45. First resistance 45 is connected in parallel with first amplifier 41.

First resistance 45 is connected to between the input and output ends of first amplifier 41. The input end of first amplifier 41 is connected to the output end of first photodiode 21; the output end of first amplifier 41 is connected to the input end of level shift circuit 13.

As shown in FIG. 5, second TIA 33 includes second amplifier 42 and second resistance 46. Second resistance 46 is connected in parallel with second amplifier 42. Here, the resistance value of second resistance 46 is smaller than that of first resistance 45. Preferably, it is ½ that of first resistance 45.

Second resistance 46 is connected to between the input and output ends of second amplifier 42. The input end of second amplifier 42 is connected to the output end of second photodiode 38; the output end of second amplifier 42 is connected to the input end of peak hold circuit 15.

The resistance value of second resistance 46 is ½ that of first resistance 45, and thus the displacement range of second voltage Vb is ½ that of first voltage Va.

Optical reception circuit 30 of this embodiment has operation and effects same as those of the first embodiment, and thus their description is omitted.

As described above, optical reception circuit 30 of this embodiment uses peak hold circuit 15 to generate threshold voltage Vth. Meanwhile, an existing optical reception circuit uses a peak detecting unit and an average value detecting unit to generate a threshold voltage. In other words, optical reception circuit 30 generates threshold voltage Vth using circuit components less than the existing optical reception circuit. Resultingly, optical reception circuit 30 consumes less current than the existing one when generating threshold voltage Vth.

In optical reception circuit 30 of this embodiment, converter circuit 143 and comparator 16 are connected with each other through peak hold circuit 15. Optical reception circuit 30 uses peak hold circuit 15 for example to generate threshold voltage Vth higher than minimum signal voltage Vio and lower than maximum signal voltage Vio. Then, optical reception circuit 30 outputs voltage Vo on the basis of threshold voltage Vth, which suppresses the distortion of the output waveform of comparator 16.

Further, in this embodiment, the resistance value of second resistance 46 is made ½ that of first resistance 45 to make second voltage Vb output from second TIA 32 lower than first voltage Va. Accordingly, photodetectors of the same light receiving area and at the same time of the same efficiency with which a light current is converted to a voltage can be used for photodetector 11 and second photodetector 31 to allow the displacement range of threshold voltage Vth to be adjusted.

Optical reception circuit 30 of this embodiment has displacement range A2 of second voltage Vb that is ½ displacement range A1 of first voltage Va. Resultingly, optical reception circuit 30 generates threshold voltage Vth that is close to ½ the fluctuation range of signal voltage Vio. Then, optical reception circuit 30 outputs voltage Vo on the basis of threshold voltage Vth, which further suppresses the distortion of the output waveform of comparator 16.

Fourth Exemplary Embodiment

Figure 6:
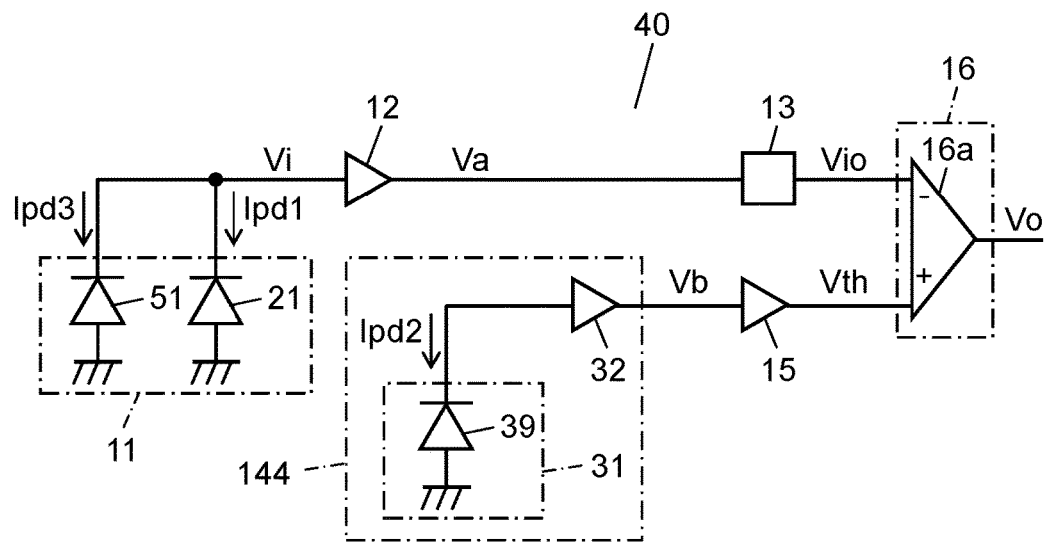
FIG. 6 is an outline block diagram of an optical reception circuit according to the fourth exemplary embodiment.

FIG. 6 is an outline block diagram of optical reception circuit 40 according to the fourth exemplary embodiment. As shown in FIG. 6, optical reception circuit 40 of this embodiment is different from that of the first embodiment in that second photodetector 31 includes second photodiode 39 that is different from second photodiode 35. Further, this embodiment is different from the first embodiment in that first photodetector 11 includes first photodiode 21 and third photodiode 51. In this embodiment, a component same as that of the first embodiment is given the same reference mark to omit its description.

The anode side of third photodiode 51 is grounded. The cathode side of third photodiode 51 is connected to the input end of first TIA 12.

The anode side of second photodiode 39 is grounded. The cathode side of second photodiode 39 is connected to the input end of second TIA 32.

Here, the light receiving area where second photodiode 51 receives light signals and that of second photodiode 39 are equal to that of first photodiode 21.

Resultingly, light current Ipd1 flowing through first photodiode 21, light current Ipd2 flowing through second photodiode 39, and light current Ipd3 flowing through third photodiode 51 are equal to one another. As shown in FIG. 6, first photodetector 11 includes first photodiode 21 and third photodiode 51 connected in parallel with each other, resulting in displacement range A2 of second voltage Vb being ½ displacement range A1 of first voltage Va.

Optical reception circuit 40 of this embodiment has operation and effects same as those of the first embodiment, and thus their description is omitted.

As described above, optical reception circuit 40 of this embodiment uses peak hold circuit 15 to generate threshold voltage Vth. Meanwhile, an existing optical reception circuit uses a peak detecting unit and an average value detecting unit to generate a threshold voltage. In other words, optical reception circuit 40 generates threshold voltage Vth using circuit components less than the existing optical reception circuit. Resultingly, optical reception circuit 40 consumes less current than the existing one when generating threshold voltage Vth.

In optical reception circuit 40 of this embodiment, converter circuit 144 and comparator 16 are connected with each other through peak hold circuit 15. Optical reception circuit 40 uses peak hold circuit 15 for example to generate threshold voltage Vth higher than minimum signal voltage Vio and lower than maximum signal voltage Vio. Then, optical reception circuit 40 outputs voltage Vo on the basis of threshold voltage Vth, which suppresses the distortion of the output waveform of comparator 16.

Further, optical reception circuit 40 of this embodiment is provided with first photodiode 21 and third photodiode 51 in first photodetector 11. Resultingly, optical reception circuit 40 makes a light current flowing through second photodetector 31 less than that through first photodetector 11 to allow the displacement range of threshold voltage Vth to be adjusted. Optical reception circuit 40 adjusts the displacement range of threshold voltage Vth to light current Ipd2. Consequently, TIAs of the same efficiency with which a light current is converted to a voltage can be used for first TIA 12 and second TIA 32.

Optical reception circuit 40 of this embodiment has displacement range A2 of second voltage Vb that is ½ displacement range A1 of first voltage Va. Resultingly, optical reception circuit 40 generates threshold voltage Vth that is close to ½ the fluctuation range of signal voltage Vio. Then, optical reception circuit 40 outputs voltage Vo on the basis of threshold voltage Vth, which further suppresses the distortion of the output waveform of comparator 16.

In this embodiment, first photodetector 11 includes two photodiodes connected to each other in parallel, where more than two photodiodes may be provided. Besides, second photodetector 31 may have two or more photodiodes. It is only required that displacement range A2 of second voltage Vb is smaller than displacement range A1 of first voltage Va as a result that the quantity and/or a manner of connecting photodiodes are adjusted. Further, displacement range A2 of second voltage Vb is preferably ½ displacement range A1 of first voltage Va.

Fifth Exemplary Embodiment

Figure 7:
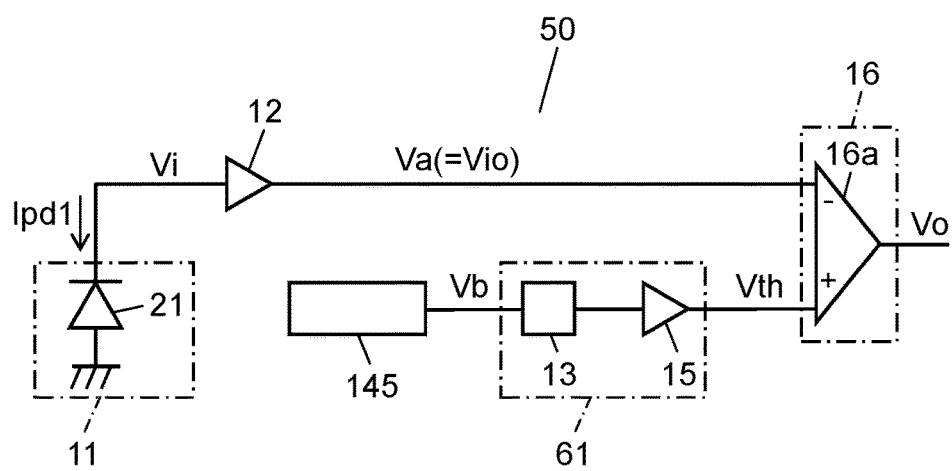
FIG. 7 is an outline block diagram of an optical reception circuit according to the fifth exemplary embodiment.

FIG. 7 is an outline block diagram of optical reception circuit 50 according to the fifth exemplary embodiment. As shown in FIG. 7, this embodiment is different from the first embodiment in that optical reception circuit 50 is provided with hold circuit 61 composed of level shift circuit 13 and peak hold circuit 15, as well as in that level shift circuit 13 is not connected to first TIA 12. In this embodiment, a component same as that of the first embodiment is given the same reference mark to omit its description.

The input end of hold circuit 61 is connected to the output end of converter circuit 145. Converter circuit 145 has the same configuration as that of converter circuit 14, namely converter circuit 145 is provided with second photodetector 31 and second TIA 32. Second photodetector 31 includes second photodiode 35. Second photodiode 35 receives a light signal and converts it to light current Ipd2 (a second light current).

The output end of hold circuit 61 is connected to the non-inverting input end of comparator 16. Hold circuit 61, when receiving second voltage Vb output from converter circuit 145, holds a peak voltage of voltages within a range higher than second voltage Vb by a given value, higher than minimum first voltage Va, and lower than maximum first voltage Va.

Hereinafter, a concrete description is made. Converter circuit 145 produces second voltage Vb within a range higher than minimum first voltage Va and lower than maximum first voltage Va. The output end of converter circuit 145 is connected to hold circuit 61. The output end of converter circuit 145 is connected to the input end of level shift circuit 13 of hold circuit 61. Level shift circuit 13 shifts second voltage Vb to the positive side by shift amount ΔVs. Level shift circuit 13 outputs the resulting voltage to peak hold circuit 15. Here, shift amount ΔVs is smaller than ½ the displacement range of first voltage Va. The output end of level shift circuit 13 is connected to the input end of peak hold circuit 15. Peak hold circuit 15 holds a peak voltage. More specifically, peak hold circuit 15 holds a peak voltage of voltages within a range higher than second voltage Vb by shift amount ΔVs, higher than minimum first voltage Va, and lower than maximum first voltage Va.

The output end of peak hold circuit 15 is connected to the non-inverting input end of comparator 16. Peak hold circuit 15 outputs to comparator 16 threshold voltage Vth (a second threshold voltage) that is roughly equal to the voltage shifted by level shift circuit 13.

Optical reception circuit 50 of this embodiment uses peak hold circuit 15 in hold circuit 61 to generate threshold voltage Vth. Meanwhile, an existing optical reception circuit uses a peak detecting unit and an average value detecting unit to generate a threshold voltage. In other words, optical reception circuit 50 generates threshold voltage Vth using circuit components less than the existing optical reception circuit. Resultingly, optical reception circuit 50 consumes less current than the existing one when generating threshold voltage Vth.

In optical reception circuit 50 of this embodiment, converter circuit 145 and comparator 16 are connected with each other through hold circuit 61 composed of level shift circuit 13 and peak hold circuit 15. Optical reception circuit 50 uses peak hold circuit 15 for example to generate threshold voltage Vth. Then, optical reception circuit 50 outputs voltage Vo on the basis of threshold voltage Vth, which suppresses the distortion of the output waveform of comparator 16.

Hereinbefore, the present disclosure is described on the basis of the first through fifth embodiments, but is not limited to them. Other examples include the following.

In the above-described fifth embodiment, level shift circuit 13 is connected to between converter circuit 145 and peak hold circuit 15, but is not limited to this case.

Figure 8:
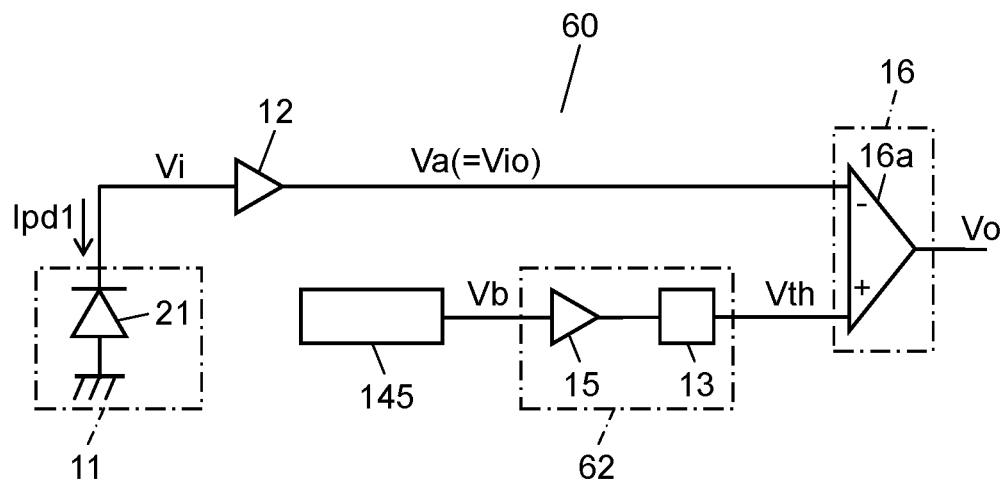
FIG. 8 is an outline block diagram of another optical reception circuit according to the fifth embodiment.

FIG. 8 is an outline block diagram of another optical reception circuit 60 according to the fifth embodiment. As shown in FIG. 8, level shift circuit 13 may be connected to between peak hold circuit 15 and comparator 16.

As shown in FIG. 8, optical reception circuit 60 includes hold circuit 62 composed of level shift circuit 13 and peak hold circuit 15.

The input end of hold circuit 62 is connected to the output end of converter circuit 145. The output end of hold circuit 62 is connected to the non-inverting input end of comparator 16. Hold circuit 62, when receiving second voltage Vb output from converter circuit 145, holds a peak voltage of voltages within a range higher than second voltage Vb by a given value, higher than minimum first voltage Va, and lower than maximum first voltage Va.

Hereinafter, a concrete description is made.

Converter circuit 145 produces second voltage Vb within a range higher than minimum first voltage Va and lower than maximum first voltage Va. The output end of converter circuit 145 is connected to hold circuit 62. The output end of converter circuit 145 is connected to the input end of peak hold circuit 15 in hold circuit 62. The output end of peak hold circuit 15 is connected to the input end of level shift circuit 13. The output end of level shift circuit 13 is connected to the non-inverting input end of comparator 16. Level shift circuit 13 shifts the voltage held by peak hold circuit 15 to the positive side by shift amount ΔVs to generate threshold voltage Vth and outputs the resulting voltage to comparator 16. Here, shift amount ΔVs is smaller than ½ the displacement range of first voltage Va.

Optical reception circuit 60 uses peak hold circuit 15 in hold circuit 62 to generate threshold voltage Vth. Meanwhile, an existing optical reception circuit uses a peak detecting unit and an average value detecting unit to generate a threshold voltage. In other words, optical reception circuit 60 generates threshold voltage Vth using circuit components less than the existing optical reception circuit. Resultingly, optical reception circuit 60 consumes less current than the existing one when generating threshold voltage Vth.

In optical reception circuit 60, converter circuit 145 and comparator 16 are connected with each other through hold circuit 62 composed of level shift circuit 13 and peak hold circuit 15. Optical reception circuit 60 uses peak hold circuit 15 for example to generate threshold voltage Vth. Then, optical reception circuit 60 outputs voltage Vo on the basis of threshold voltage Vth, which suppresses the distortion of the output waveform of comparator 16.

In the first and second embodiments, the description is made of the example where light current Ipd2 flowing through second photodetector 31 is ½ light current Ipd1 flowing through first photodetector 11. However, the way to make light current Ipd2 flowing through second photodetector 31 smaller than light current Ipd1 flowing through first photodetector 11 is not limited to the example.

In the first embodiment for example, second photodiode 35 of second photodetector 31 is used that has a photoelectric conversion efficiency same as that of first photodiode 21 of first photodetector 11. However, the second photodiode of second photodetector 31 may have a photoelectric conversion efficiency lower than that of first photodiode 21 of first photodetector 11; further, the efficiency may be ½ that of first photodiode 21 of first photodetector 11.

As another example, the second photodiode may have a photoelectric conversion efficiency same as that of first photodiode 21 and an incident angle (at which the second photodiode receives a light signal) different from that (at which first photodiode 21 receives a light signal) of first photodiode 21. At this moment, the incident angle of the second photodiode is set so that the light amount of light signals received by the second photodiode is ½ that received by first photodiode 21.

Even with the above-described configuration, light current Ipd2 flowing through second photodetector 31 can be made smaller than light current Ipd1 flowing through first photodetector 11 to allow the displacement range of threshold voltage Vth to be adjusted. The displacement range of threshold voltage Vth can be adjusted to light current Ipd2. Accordingly, TIAs of the same efficiency with which a light current is converted to a voltage can be used for first TIA 12 and second TIA 32.

An optical reception circuit may be used that has a conversion efficiency of second TIA 32 lower than that of first TIA 12. Further, an optical reception circuit may be used that has a conversion efficiency of second TIA 32 lower than ½ that of first TIA 12. Here, a conversion efficiency refers to that with which a light current is converted to a voltage. By adjusting the conversion efficiencies of second TIA 32 and first TIA 12, the displacement range of threshold voltage Vth may be adjusted.

In the above-described embodiments, first photodetector 11 and second photodetector 31 may be either on the same chip or different chips.

Components included in first photodetector 11 and second photodetector 31 for converting a light signal to a light current may be either on the same integrated circuit or different ones.

In the above-described first through fourth embodiments, displacement range A2 of second voltage Vb is ½ displacement range A1 of first voltage Va, but not limited to the example.

It is only required that the displacement range of second voltage Vb is smaller than that of first voltage Va and that second voltage Vb is higher than the minimum signal voltage Vio that is first voltage Va after shifted and lower than maximum signal voltage Vio.

It is only required that the displacement range of second voltage Vb in the fifth embodiment is smaller than that of first voltage Va and that second voltage Vb after shifted is higher than the minimum signal voltage Vio and lower than maximum signal voltage Vio.

In the second embodiment, light blocking part 37 is placed so as to cover ½ the light receiving area where second photodiode 36 receives light signals, but not limited to the example.

It is only required that light blocking part 37 is provided so that the light amount of light signals received by second photodiode 36 is smaller than that received by first photodiode 21, preferably ½ that received by first photodiode 21.

Besides, light blocking part 37 may be formed on a surface where light signals are received as a wall for blocking light signals for example.

With the configuration as described above, light current Ipd2 flowing through second photodetector 31 is made smaller than light current Ipd1 flowing through first photodetector 11 to allow the displacement range of threshold voltage Vth to be adjusted.

The above items and/or the first through fifth embodiments may be combined to implement the present disclosure.

According to the optical reception circuit of the disclosure, the converter and the comparator are connected with each other through the peak hold circuit. In the optical reception circuit of the disclosure, a voltage held by the peak hold circuit represents a threshold voltage. Consequently, the simple circuit structure suppresses the distortion of the output waveform of the comparator while reducing a consumption current when generating threshold voltage.

The invention claimed is:

1. An optical reception circuit comprising:
    a first photodetector that receives a light signal and converts the light signal to a first light current;
    a first transimpedance amplifier that is connected to the first photodetector and converts the first light current to a first voltage;
    a level shift circuit that is connected to the first transimpedance amplifier and generates a signal voltage that is the first voltage shifted to a low-voltage side;
    a second photodetector that receives the light signal and converts the light signal to a second light current;
    a second transimpedance amplifier that is connected to the second photodetector and converts the second light current to a second voltage having a peak voltage that is higher than a minimum voltage of the signal voltage and lower than a maximum voltage of the signal voltage;
    a peak hold circuit that is connected to the second transimpedance amplifier and holds the peak voltage of the second voltage as a threshold voltage; and
    a comparator that is connected to the level shift circuit and the peak hold circuit and compares the signal voltage with the threshold voltage,
    wherein a displacement range of the second voltage is smaller than a displacement range of the first voltage.

2. The optical reception circuit of claim 1, wherein the second light current is less than the first light current.

3. The optical reception circuit of claim 2, wherein a light receiving area of the second photodetector is smaller than a light receiving area of the first photodetector.

4. The optical reception circuit of claim 2,
    wherein the second photodetector includes a light blocking part that partially blocks the light received by the second photodetector, the light blocking part formed so that an amount of light received by the second photodetector is smaller than an amount of light received by the first photodetector, wherein a light receiving area of the second photodetector is equal to a light receiving area of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

5. The optical reception circuit of claim 2, wherein a photoelectric conversion efficiency of the second photodetector is lower than a photoelectric conversion efficiency of the first photodetector, wherein a light receiving area of the second photodetector is equal to a light receiving area of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

6. The optical reception circuit of claim 1, wherein the first transimpedance amplifier includes a first amplifier and a first resistance connected in parallel with the first amplifier, wherein the second transimpedance amplifier includes a second amplifier and a second resistance connected in parallel with the second amplifier, wherein a resistance value of the second resistance is smaller than a resistance value of the first resistance, wherein a light receiving area of the second photodetector is equal to a light receiving area of the first photodetector, and wherein a photoelectric conversion efficiency of the second photodetector is equal to a photoelectric conversion efficiency of the first photodetector.

7. The optical reception circuit of claim 1, wherein the first photodetector includes a plurality of photodiodes connected in parallel with one another, wherein a light receiving area of each of the plurality of photodetectors is equal to a light receiving area of the second photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

8. The optical reception circuit of claim 1, wherein the displacement range of the second voltage is ½ the displacement range of the first voltage.

9. An optical reception circuit comprising:

a first photodetector that receives a light signal and converts the light signal to a first light current;

a first transimpedance amplifier that is connected to the first photodetector and converts the first light current to a first voltage;

a second photodetector that receives the light signal and converts the light signal to a second light current;

a second transimpedance amplifier that is connected to the second photodetector and converts the second light current to a second voltage having a peak voltage that is higher than a minimum voltage of the first voltage and lower than a maximum voltage of the first voltage;

a hold circuit that is connected to the second transimpedance amplifier and holds a peak voltage of the second voltage shifted to a high voltage side as a threshold voltage; and a comparator that is connected to the first transimpedance amplifier and the hold circuit and compares the first voltage with the threshold voltage, wherein a displacement range of the second voltage is smaller than a displacement range of the first voltage.

10. The optical reception circuit of claim 9, wherein the hold circuit includes a level shift circuit and a peak hold circuit.

11. The optical reception circuit of claim 9, wherein the second light current is less than the first light current.

12. The optical reception circuit of claim 11, wherein a light receiving area of the second photodetector is smaller than a light receiving area of the first photodetector, wherein a photoelectric conversion efficiency of the second photodetector is equal to or lower than a photoelectric conversion efficiency of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

13. The optical reception circuit of claim 11, wherein the second photodetector includes a light blocking part that partially blocks the light received by the second photodetector, the light blocking part formed so that an amount of light received by the second photodetector is smaller than an amount of light received by the first photodetector, wherein a light receiving area of the second photodetector is equal to a light receiving area of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

14. The optical reception circuit of claim 11, wherein a photoelectric conversion efficiency of the second photodetector is lower than a photoelectric conversion efficiency of the first photodetector, wherein a light receiving area of the second photodetector is equal to a light receiving area of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

15. The optical reception circuit of claim 9, wherein the first transimpedance amplifier includes a first amplifier and a first resistance connected in parallel with the first amplifier, wherein the second transimpedance amplifier includes a second amplifier and a second resistance connected in parallel with the second amplifier, wherein a resistance value of the second resistance is smaller than a resistance value of the first resistance, wherein a light receiving area of the second photodetector is equal to a light receiving area of the first photodetector, and wherein a photoelectric conversion efficiency of the second photodetector is equal to a photoelectric conversion efficiency of the first photodetector.

16. The optical reception circuit of claim 9,
wherein the first photodetector includes a plurality of photodiodes connected in parallel with one another, wherein a light receiving area of each of the plurality of photodiodes is equal to a light receiving area of the second photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

17. The optical reception circuit of claim 9, wherein the displacement range of the second voltage is ½ the displacement range of the first voltage.

18. The optical reception circuit of claim 3,
wherein a photoelectric conversion efficiency of the second photodetector is equal to or lower than a photoelectric conversion efficiency of the first photodetector, and wherein a conversion efficiency of the second transimpedance amplifier at which the second transimpedance amplifier converts the second light current to the second voltage is equal to or lower than a conversion efficiency of the first transimpedance amplifier at which the first transimpedance amplifier converts the first light current to the first voltage.

* * * * *